(12) United States Patent
Wu et al.

(10) Patent No.: US 10,100,970 B1
(45) Date of Patent: Oct. 16, 2018

(54) ELECTRONIC DEVICE AND HINGE STRUCTURE

(71) Applicant: ACER INCORPORATED, New Taipei (TW)

(72) Inventors: Chun-Hsien Wu, New Taipei (TW); Shun-Bin Chen, New Taipei (TW); Wen-Chieh Chen, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 15/710,840

(22) Filed: Sep. 21, 2017

(30) Foreign Application Priority Data

Aug. 10, 2017 (TW) .............................. 106127094 A

(51) Int. Cl.
*E05D 15/32* (2006.01)
*F16M 13/00* (2006.01)
(Continued)

(52) U.S. Cl.
CPC .............. *F16M 13/005* (2013.01); *E05D 3/18* (2013.01); *E05D 11/00* (2013.01); *F16C 11/04* (2013.01);
(Continued)

(58) Field of Classification Search
CPC .... E05D 3/06; E05D 3/16; E05D 3/14; E05D 11/1021; E05D 2003/163; E05D 2003/166; E05D 3/18; E05D 3/186; E05D 11/00; E05F 1/14; E05F 3/18; E05F 3/20; E05F 5/02; E05F 5/006; E05Y 2201/21; E05Y 2201/212; E05Y 2201/264; E05Y 2201/412; E05Y 2201/424; E05Y 2201/428; E05Y 2201/496; E05Y 2201/254; E05Y 2800/21; E05Y 2900/20; E05Y 2900/512; E05Y 2900/538; E05Y 2201/474; Y10T 16/2771; Y10T 16/304; Y10T 16/5383; Y10T 16/53832; Y10T 16/53833; Y10T 16/53843; Y10T 16/547;
(Continued)

(56) References Cited

U.S. PATENT DOCUMENTS 2,073,689 A * 3/1937 Gotzinger ................. E05D 3/18
16/358
2,437,192 A * 3/1948 Glanz ...................... E05D 3/186
16/50
(Continued)

*Primary Examiner* — Chuck Y Mah
(74) *Attorney, Agent, or Firm* — Winston Hsu

(57) ABSTRACT

A hinge structure includes a first bracket, a second bracket, a first fixing member connected to the first bracket, a second fixing member connected to the second bracket, a first linking member, a second linking member, a first resilient member, a second resilient member, a first linking bar pivotally connected to the second bracket, a second linking bar pivotally connected to the first bracket, a first sliding member and a second sliding member. The first linking member and the first resilient member are disposed on the first fixing member. The second linking member and the second resilient member are disposed on the second fixing member. The first linking bar is pivotally connected to the second linking bar. The first sliding member is connected to the first linking member and the first linking bar. The second sliding member is connected to the second linking member and the second linking bar.

8 Claims, 10 Drawing Sheets

(51) Int. Cl.
*F16C 11/04* (2006.01)
*E05D 3/18* (2006.01)
*F16M 11/10* (2006.01)
*H05K 5/02* (2006.01)
*E05D 11/00* (2006.01)

(52) U.S. Cl.
CPC ........... *F16M 11/10* (2013.01); *H05K 5/0226* (2013.01); *E05Y 2201/474* (2013.01); *E05Y 2900/606* (2013.01)

(58) Field of Classification Search
CPC . Y10T 16/5476; Y10T 16/299; F16M 13/005; F16M 11/10; F16C 11/04; H05K 5/0226; F05Y 2900/606

See application file for complete search history.

(56) References Cited

U.S. PATENT DOCUMENTS

| | | | | | |
|---|---|---|---|---|---|
| 3,368,237 | A | * | 2/1968 | Bierlich | E05D 3/186 16/358 |
| 3,673,635 | A | * | 7/1972 | Cencioni | E05D 3/06 16/358 |
| 2001/0025398 | A1 | * | 10/2001 | Zetti | E05D 3/16 16/370 |
| 2006/0282983 | A1 | * | 12/2006 | Zetti | E05D 3/16 16/287 |
| 2009/0241288 | A1 | * | 10/2009 | Zetti | E05D 3/16 16/236 |
| 2012/0090135 | A1 | * | 4/2012 | Soh | E05D 11/0081 16/250 |
| 2012/0120618 | A1 | * | 5/2012 | Bohn | G06F 1/1618 361/749 |
| 2015/0031224 | A1 | * | 1/2015 | Dreisewerd | E05D 3/186 439/165 |
| 2015/0267452 | A1 | * | 9/2015 | Zetti | E05D 3/16 16/65 |
| 2015/0275557 | A1 | * | 10/2015 | Adair | E05D 11/0081 16/334 |
| 2017/0138103 | A1 | * | 5/2017 | Hong | E05D 3/18 |

\* cited by examiner

ELECTRONIC DEVICE AND HINGE STRUCTURE

BACKGROUND OF THE INVENTION

1. Field of the Invention

The invention relates to an electronic device and a hinge structure and, more particularly, to a hinge structure with auto-return function and an electronic device equipped with the hinge structure.

2. Description of the Prior Art

A hinge structure nowadays is used widely in various applications. For example, a door, a notebook computer, and so on is equipped with the hinge structure, so as to achieve open/close function. Referring to FIG. 1, FIG. 1 is a perspective view illustrating a hinge structure 1 of the prior art. As shown in FIG. 1, the hinge structure 1 consists of two brackets 10, two linking bars 12 and two sliding members 14. The linking bar 12 can drive the sliding member 14 to slide within a sliding groove 100 of the bracket 10, such that the two brackets 10 can be folded with respect to each other. The hinge structure 1 generates friction to function by means of a concave-convex resilient member 16 disposed on the sliding member 14. However, the friction may abrade the concave-convex resilient member 16 and then the friction may decay, such that the hinge structure 1 may not pass life-cycle test. Furthermore, when the external force is released from the hinge structure 1 after the two brackets 10 are folded with respect to each other, the two brackets 10 cannot return to an expanded state automatically due to the friction generated by the concave-convex resilient member 16.

SUMMARY OF THE INVENTION

An objective of the invention is to provide a hinge structure with auto-return function and an electronic device equipped with the hinge structure, so as to solve the aforesaid problems.

According to an embodiment of the invention, a hinge structure comprises a first bracket, a second bracket, a first fixing member, a second fixing member, a first linking member, a second linking member, a first resilient member, a second resilient member, a first linking bar, a second linking bar, a first sliding member and a second sliding member. The first bracket has a first sliding groove. The second bracket has a second sliding groove. The first fixing member is connected to the first bracket. The second fixing member is connected to the second bracket. The first linking member is movably disposed on the first fixing member. The second linking member is movably disposed on the second fixing member. The first resilient member is disposed on the first fixing member. Opposite ends of the first resilient member abut against the first fixing member and the first linking member. The second resilient member is disposed on the second fixing member. Opposite ends of the second resilient member abut against the second fixing member and the second linking member. The first linking bar is pivotally connected to the second bracket. The second linking bar is pivotally connected to the first bracket. The first linking bar and the second linking bar are pivotally connected to each other. The first sliding member is disposed in the first sliding groove and connected to the first linking member and the first linking bar. The second sliding member is disposed in the second sliding groove and connected to the second linking member and the second linking bar.

According to another embodiment of the invention, an electronic device comprises a device body and a hinge structure, wherein the hinge structure is disposed on the device body. The hinge structure comprises a first bracket, a second bracket, a first fixing member, a second fixing member, a first linking member, a second linking member, a first resilient member, a second resilient member, a first linking bar, a second linking bar, a first sliding member and a second sliding member. The first bracket has a first sliding groove. The second bracket has a second sliding groove. The first fixing member is connected to the first bracket. The second fixing member is connected to the second bracket. The first linking member is movably disposed on the first fixing member. The second linking member is movably disposed on the second fixing member. The first resilient member is disposed on the first fixing member. Opposite ends of the first resilient member abut against the first fixing member and the first linking member. The second resilient member is disposed on the second fixing member. Opposite ends of the second resilient member abut against the second fixing member and the second linking member. The first linking bar is pivotally connected to the second bracket. The second linking bar is pivotally connected to the first bracket. The first linking bar and the second linking bar are pivotally connected to each other. The first sliding member is disposed in the first sliding groove and connected to the first linking member and the first linking bar. The second sliding member is disposed in the second sliding groove and connected to the second linking member and the second linking bar.

As mentioned in the above, when the first bracket and the second bracket are folded with respect to each other, the first linking bar and the second linking bar drive the first linking member and the second linking member to move through the first sliding member and the second sliding member, respectively, so as to compress the first resilient member and the second resilient member. When the external force is released from the hinge structure, the compressed first resilient member and the compressed second resilient member generate elastic forces to push back the first linking member and the second linking member, so as to drive the first linking bar and the second linking bar to rotate through the first sliding member and the second sliding member. Consequently, the first bracket and the second bracket return to an expanded state automatically.

Furthermore, the invention may dispose the hinge structure on the device body of the electronic device. When the first bracket and the second bracket are folded with respect to each other, the device body of the electronic device can be supported on a plane by the hinge structure. At this time, the elastic forces generated by the compressed first resilient member and the compressed second resilient member are balanced off by a support force provided by the plane, such that the first bracket and the second bracket can be kept at the folded state. After removing the electronic device from the plane, the first bracket and the second bracket can return to the expanded state automatically. Moreover, since the invention uses the first resilient member and the second resilient member to provide the elastic forces, the invention can improve the decay rate of the hinge structure effectively during life-cycle test, so as to enhance the life of the hinge structure.

These and other objectives of the present invention will no doubt become obvious to those of ordinary skill in the art

DETAILED DESCRIPTION

Figure 1:
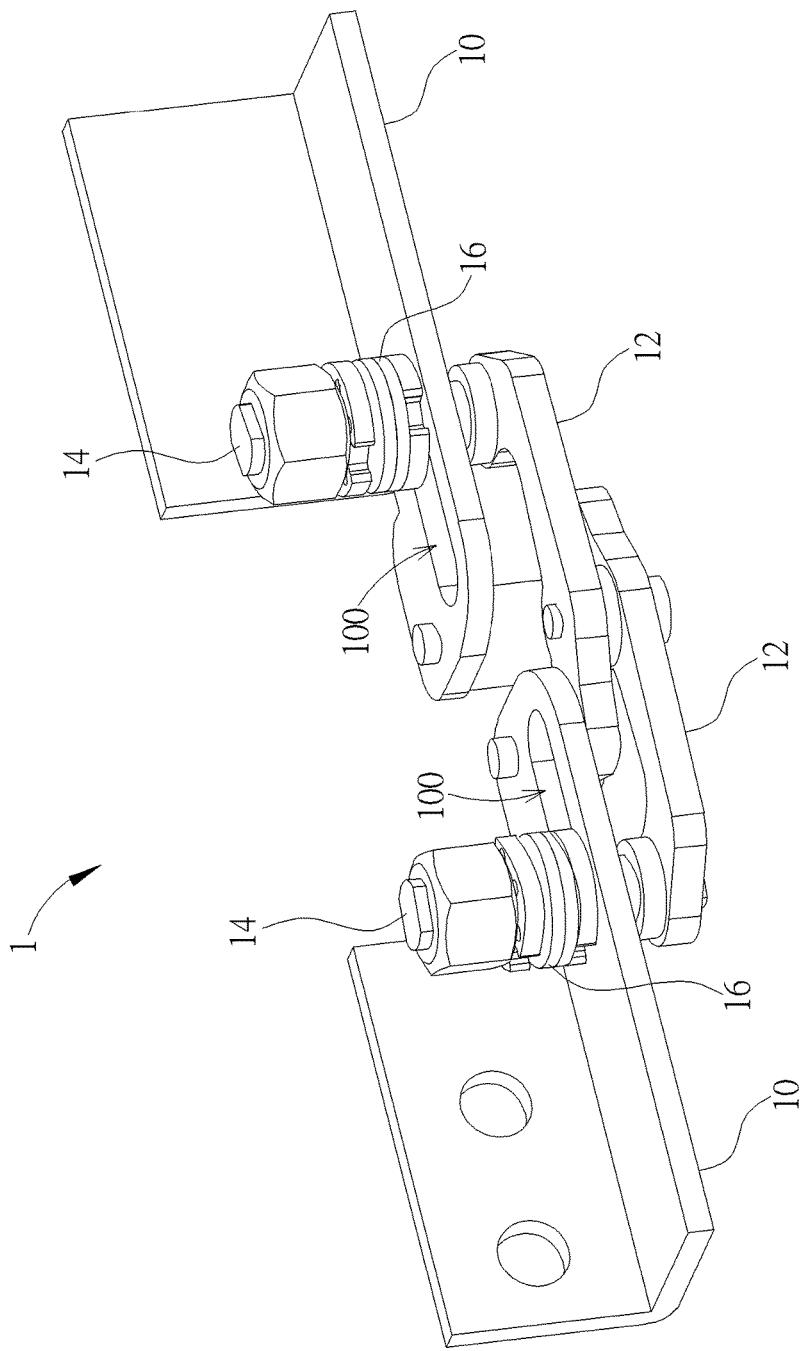
FIG. 1 is a perspective view illustrating a hinge structure of the prior art.
Figure 2:
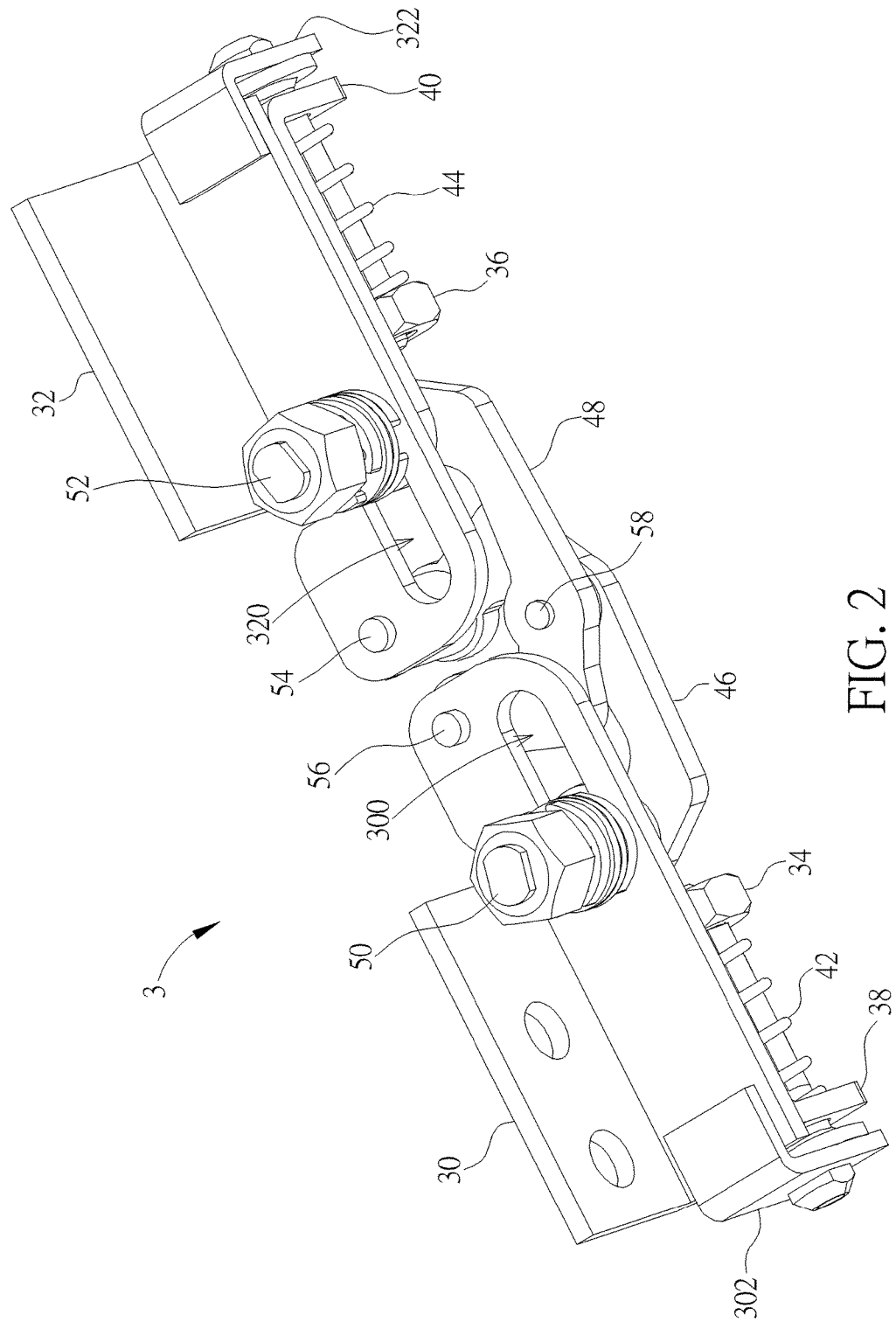
FIG. 2 is a perspective view illustrating a hinge structure according to an embodiment of the invention.
Figure 3:
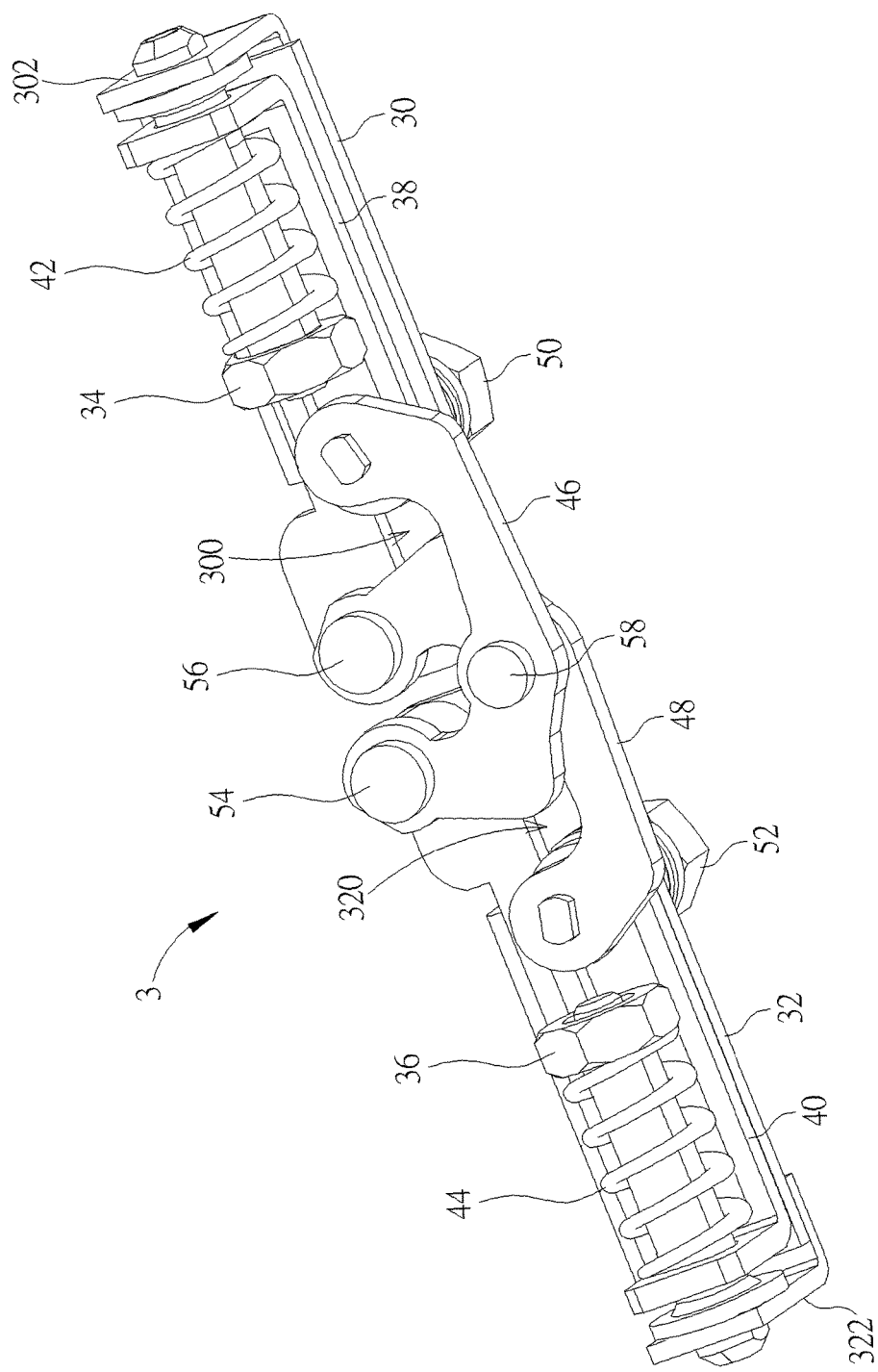
FIG. 3 is a perspective view illustrating the hinge structure shown in FIG. 2 from another viewing angle.
Figure 4:
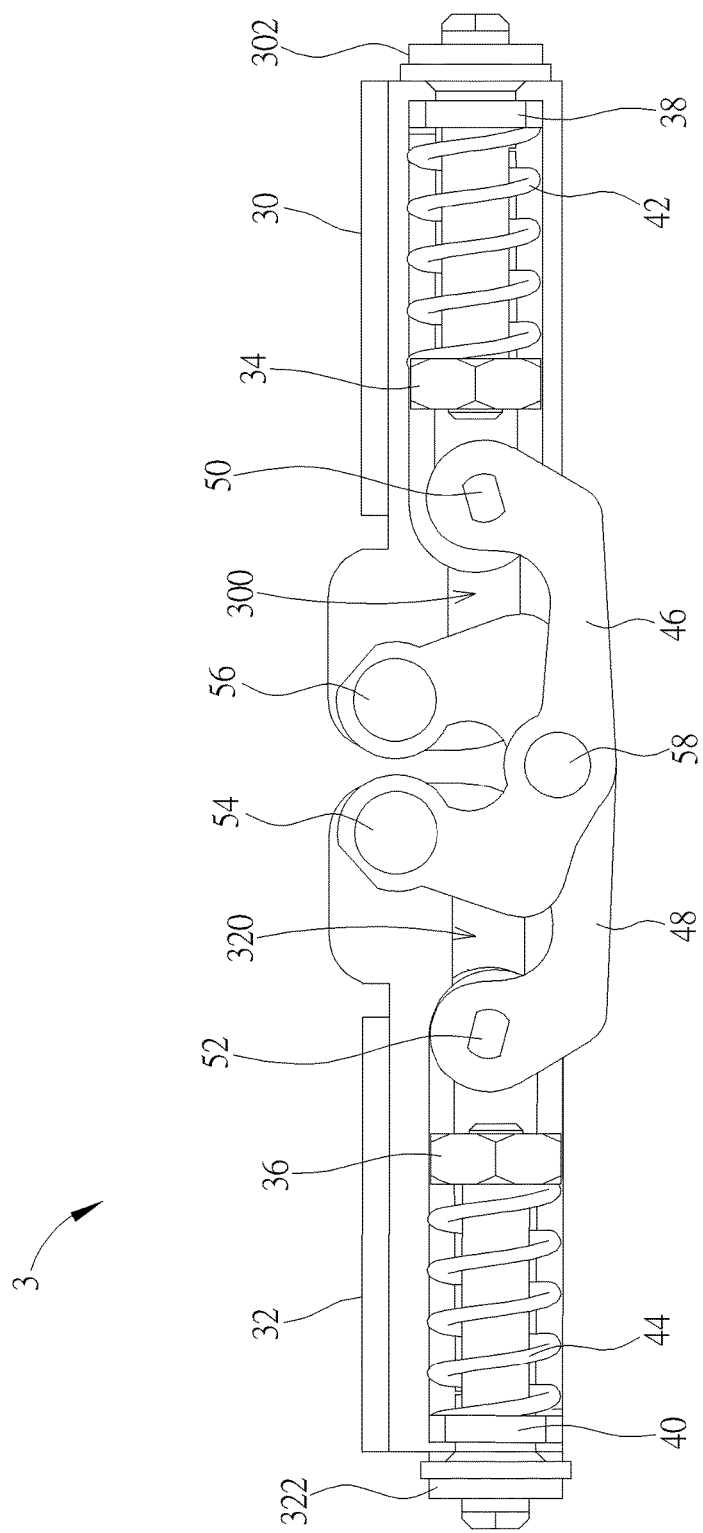
FIG. 4 is a top view illustrating the hinge structure shown in FIG. 3.
Figure 5:
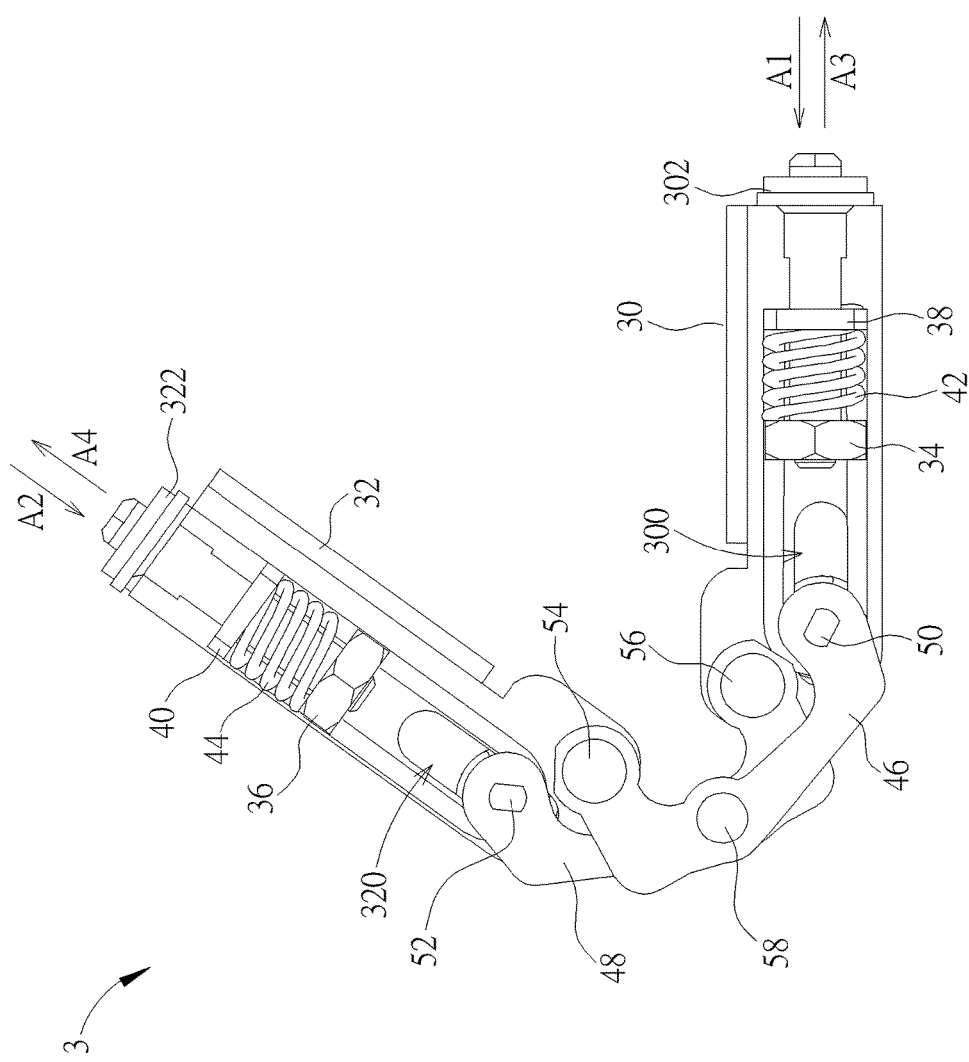
FIG. 5 is a schematic view illustrating the first bracket and the second bracket shown in FIG. 4 being folded with respect to each other.

Referring to FIGS. 2 to 5, FIG. 2 is a perspective view illustrating a hinge structure 3 according to an embodiment of the invention, FIG. 3 is a perspective view illustrating the hinge structure 3 shown in FIG. 2 from another viewing angle, FIG. 4 is a top view illustrating the hinge structure 3 shown in FIG. 3, and FIG. 5 is a schematic view illustrating the first bracket 30 and the second bracket 32 shown in FIG. 4 being folded with respect to each other.

As shown in FIGS. 2 to 5, the hinge structure 3 comprises a first bracket 30, a second bracket 32, a first fixing member 34, a second fixing member 36, a first linking member 38, a second linking member 40, a first resilient member 42, a second resilient member 44, a first linking bar 46, a second linking bar 48, a first sliding member 50 and a second sliding member 52.

The first bracket 30 has a sliding groove 300 and the second bracket 32 has a second sliding groove 320. In this embodiment, the first bracket 30 may further has a first fixing portion 302 and the second bracket 32 may further has a second fixing portion 322. The first fixing portion 302 may be a bended iron plate riveted on an end of the first bracket 30 and the second fixing portion 322 may be a bended iron plate riveted on an end of the second bracket 32. It should be noted that the first fixing portion 302 may also be formed on the first bracket 30 integrally and the second fixing portion 322 may also be formed on the second bracket 32 integrally according to practical applications.

The first fixing member 34 is connected to the first bracket 30 and the second fixing member 36 is connected to the second bracket 32. The first linking member 38 is movably disposed on the first fixing member 34 and the second linking member 40 is movably disposed on the second fixing member 36. The first resilient member 42 is disposed on the first fixing member 34 and the second resilient member 44 is disposed on the second fixing member 36. In this embodiment, the first fixing member 34 and the second fixing member 36 may be, but not limited to, screws, and the first resilient member 42 and the second resilient member 44 may be, but not limited to, springs. The invention may dispose the first resilient member 42 and the first linking member 38 on the first fixing member 34 and then rivet an end of the first fixing member 34 on the first fixing portion 302 of the first bracket 30. At this time, opposite ends of the first resilient member 42 abut against the first fixing member 34 and the first linking member 38. Similarly, the invention may dispose the second resilient member 44 and the second linking member 40 on the second fixing member 36 and then rivet an end of the second fixing member 36 on the second fixing portion 322 of the second bracket 32. At this time, opposite ends of the second resilient member 44 abut against the second fixing member 36 and the second linking member 40.

The first linking bar 46 is pivotally connected to the second bracket 32, the second linking bar 48 is pivotally connected to the first bracket 30, and the first linking bar 46 and the second linking bar 48 are pivotally connected to each other. In this embodiment, first linking bar 46 may be pivotally connected to the second bracket 32 through a pivot 54, the second linking bar 48 may be pivotally connected to the first bracket 30 through a pivot 56, and the first linking bar 46 and the second linking bar 48 may be pivotally connected to each other through a pivot 58. Accordingly, the first bracket 30 and the second bracket 32 can rotate with respect to each other by an interaction between the first linking bar 46 and the second linking bar 48.

The first sliding member 50 is disposed in the first sliding groove 300 of the first bracket 30 and connected to the first linking member 38 and the first linking bar 46. The second sliding member 52 is disposed in the second sliding groove 320 of the second bracket 32 and connected to the second linking member 40 and the second linking bar 48. When the first bracket 30 and the second bracket 32 rotate with respect to each other by the interaction between the first linking bar 46 and the second linking bar 48, the first linking bar 46 and the second linking bar 48 drive the first sliding member 50 and the second sliding member 52 to move within the first sliding groove 300 and the second sliding groove 320, respectively.

As shown in FIG. 5, when the first bracket 30 and the second bracket 32 are folded with respect to each other, the first linking bar 46 and the second linking bar 48 are driven by the first bracket 30 and the second bracket 32 to rotate with respect to each other. At this time, the first linking bar 46 and the second linking bar 48 drive the first linking member 38 and the second linking member 40 to move in the directions indicated by the arrows A1, A2 through the first sliding member 50 and the second sliding member 52, so as to compress the first resilient member 42 and the second resilient member 44. When the external force is released from the hinge structure 1, the compressed first resilient member 42 and the compressed second resilient member 44 generate elastic forces to push back the first linking member 38 and the second linking member 40 in the directions indicated by the arrows A3, A4, such that the first bracket 30 and the second bracket 32 return to the expanded state shown in FIG. 4 automatically.

It should be noted that the longer the lengths of the first sliding groove 300 and the second sliding groove 320 are, the larger the foldable angle between the first bracket 30 and the second bracket 32 is; on the contrary, the shorter the lengths of the first sliding groove 300 and the second sliding groove 320 are, the smaller the foldable angle between the first bracket 30 and the second bracket 32 is. In other words, The foldable angle between the first bracket 30 and the second bracket 32 is determined by the lengths of the first sliding groove 300 and the second sliding groove 320.

Figure 6:
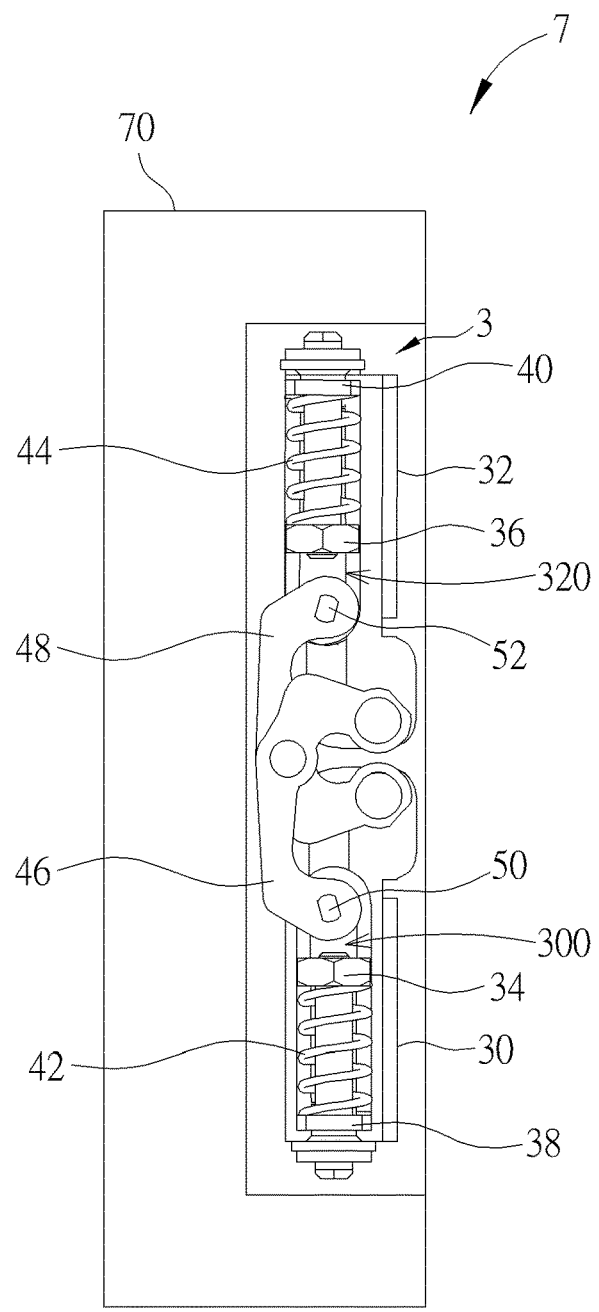
FIG. 6 is a schematic view illustrating an electronic device equipped with the hinge structure.
Figure 7:
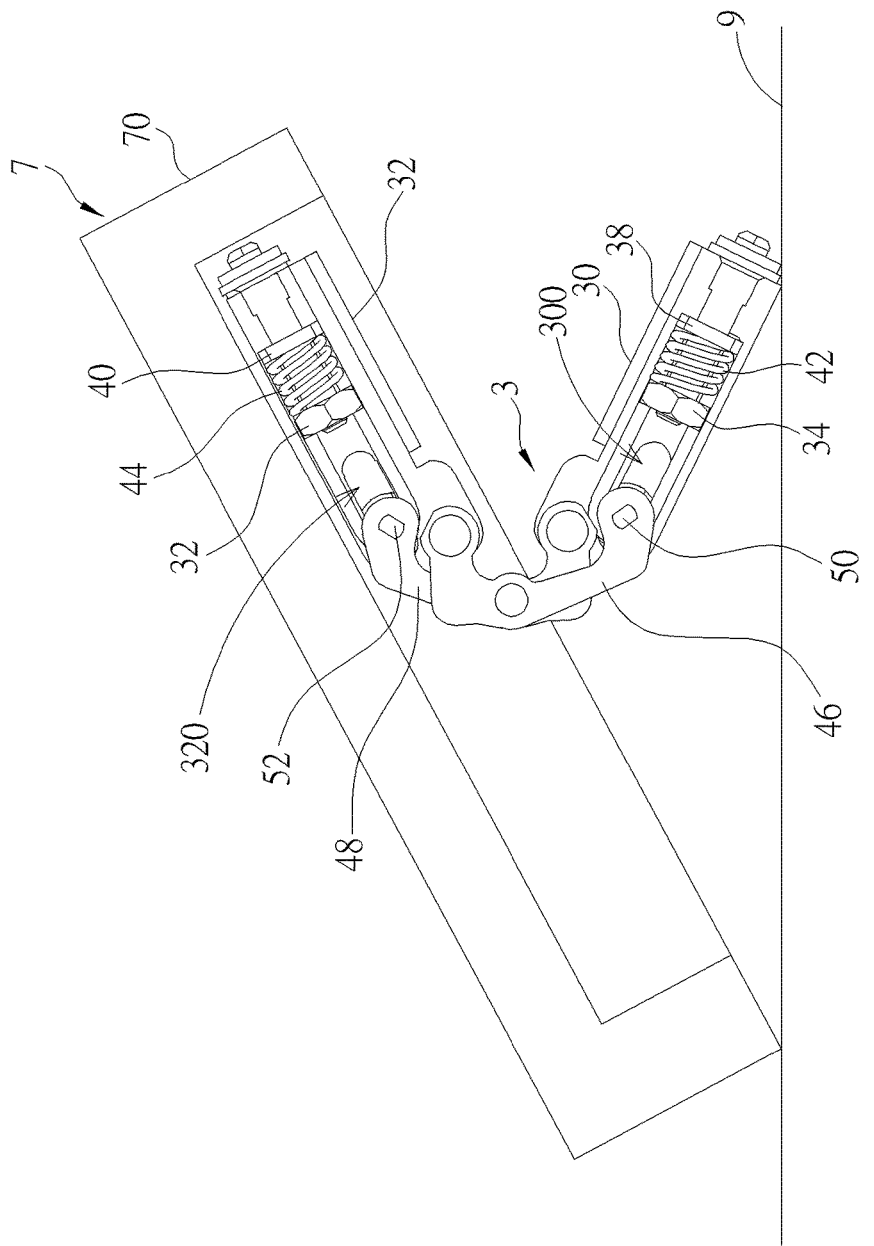
FIG. 7 is a schematic view illustrating the first bracket and the second bracket shown in FIG. 6 being folded with respect to each other.

Referring to FIGS. 6 and 7, FIG. 6 is a schematic view illustrating an electronic device 7 equipped with the hinge structure 3 and FIG. 7 is a schematic view illustrating the first bracket 30 and the second bracket 32 shown in FIG. 6 being folded with respect to each other. As shown in FIGS. 6 and 7, the electronic device 7 comprises a device body 70 and the aforesaid hinge structure 3, wherein the hinge structure 3 is disposed on the device body 70. In practical applications, the device body 70 may be a mobile phone, a tablet computer or other electronic devices. It should be noted that the hinge structure 3 of the invention may also be disposed on other devices with open/close function, so the hinge structure 3 is not limited to be disposed on the electronic device.

In this embodiment, the second bracket 32 of the hinge structure 3 may be fixed on the back of the device body 70. When the first bracket 30 and the second bracket 32 are folded with respect to each other, the device body 70 of the electronic device 7 can be supported on a plane 9 by the hinge structure 3, as shown in FIG. 7. At this time, the elastic forces generated by the compressed first resilient member 42 and the compressed second resilient member 44 are balanced off by a support force provided by the plane 9, such that the first bracket 30 and the second bracket 32 can be kept at the folded state. Accordingly, the hinge structure 3 can support the device body 70 of the electronic device 7 on the plane 9 stably. After removing the electronic device 7 from the plane 9, the first bracket 30 and the second bracket 32 can return to the expanded state shown in FIG. 6 automatically by the elastic forces generated by the compressed first resilient member 42 and the compressed second resilient member 44.

Figure 8:
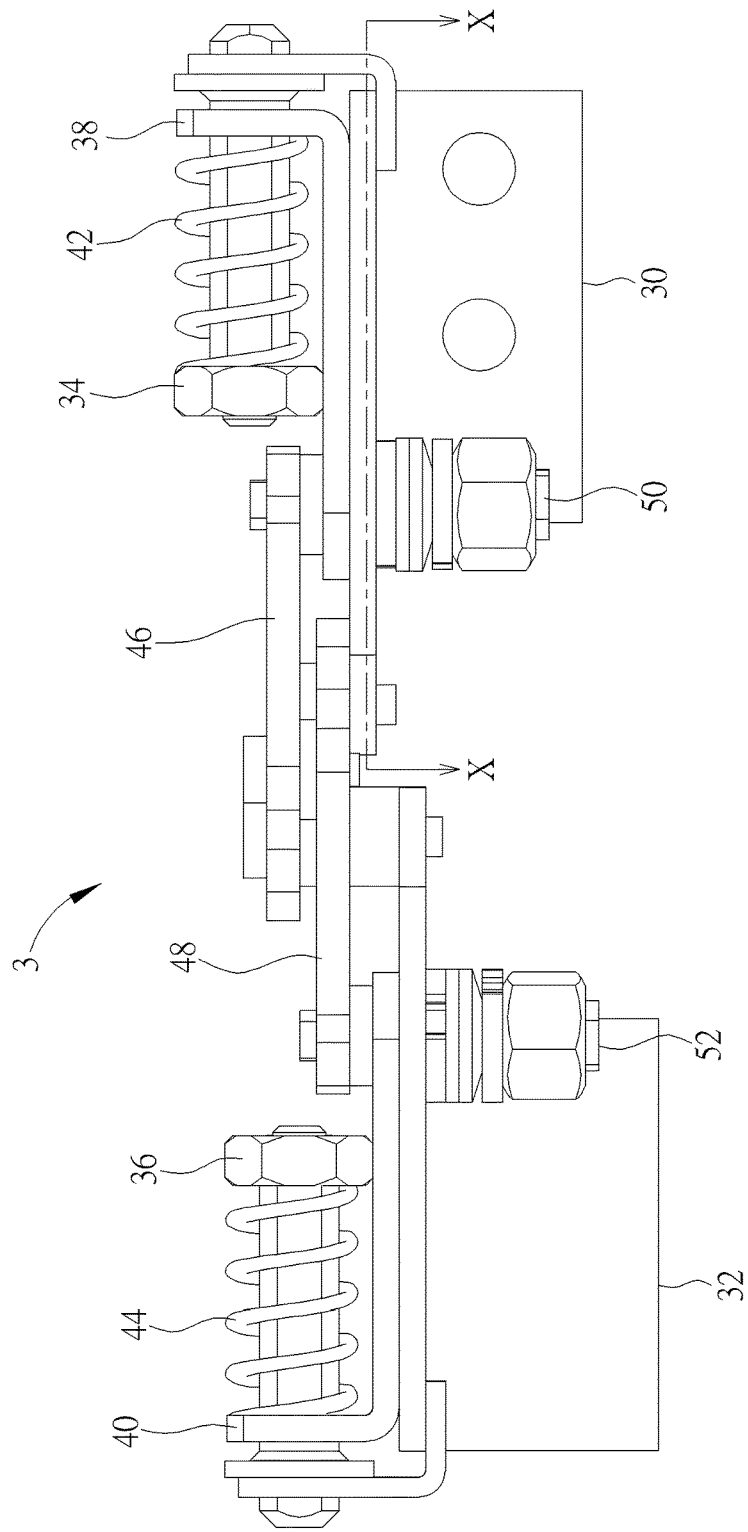
FIG. 8 is a side view illustrating the hinge structure shown in FIG. 6.
Figure 9:
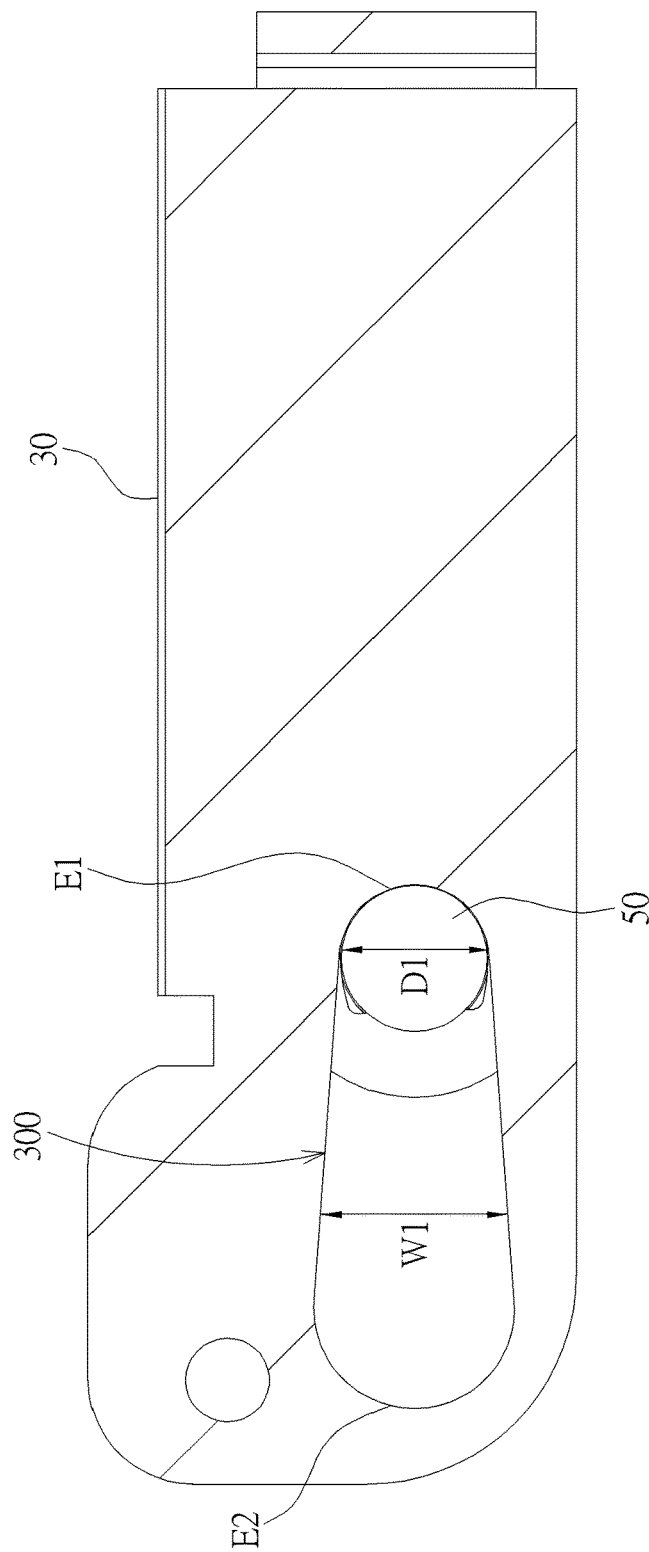
FIG. 9 is a sectional view illustrating the hinge structure along line X-X shown in FIG. 8.

Referring to FIGS. 8 and 9, FIG. 8 is a side view illustrating the hinge structure 3 shown in FIG. 6 and FIG. 9 is a sectional view illustrating the hinge structure 3 along line X-X shown in FIG. 8. As shown in FIGS. 8 and 9, the first sliding member 50 is located at a first end E1 of the first sliding groove 300 when the first bracket 30 is expanded with respect to the second bracket 32. Furthermore, the first sliding member 50 is located at a second end E2 of the first sliding groove 300 when the first bracket 30 is folded with respect to the second bracket 32 to be the state shown in FIG. 9, wherein the second end E2 is opposite to the first end E1. In this embodiment, a width W1 of the first sliding groove 300 may increase gradually from the first end E1 to the second end E2. Preferably, the width W1 at the first end E1 of the first sliding groove 300 may be slightly smaller than a diameter D1 of the first sliding member 50. When the first bracket 30 and the second bracket 32 return from the folded state shown in FIG. 7 to the expanded state shown in FIG. 6, the first sliding member 50 will interfere with the first sliding groove 300 in front of the first end E1, so as to prevent the first bracket 30 from nipping a finger while the first bracket 30 returns to the state shown in FIG. 6 immediately.

Figure 10:
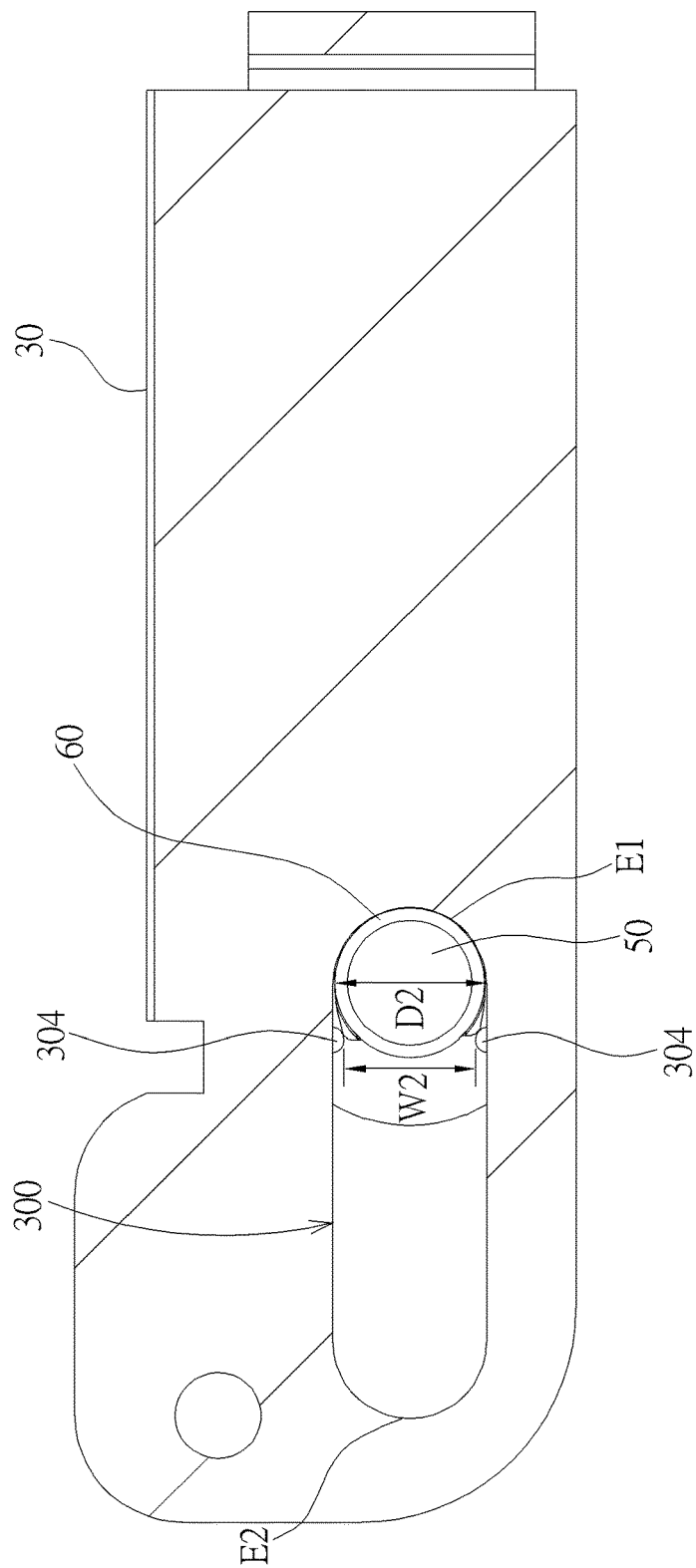
FIG. 10 is a schematic view illustrating the first sliding groove according to another embodiment of the invention.

Referring to FIG. 10, FIG. 10 is a schematic view illustrating the first sliding groove 300 according to another embodiment of the invention. As shown in FIG. 10, the first sliding groove 300 may have two protruding portions 304 opposite to each other and adjacent to the first end E1 of the first sliding groove 300. Furthermore, the hinge structure 3 may further comprise a flexible sleeve 60 disposed on the first sliding member 50. The flexible sleeve 60 can reduce the friction between the first sliding member 50 and the first sliding groove 300. In this embodiment, the flexible sleeve 60 may be made of, but not limited to, rubber. A width W2 between the two protruding portions 304 may be slightly smaller than a diameter D2 of the flexible sleeve 60. When the first bracket 30 and the second bracket 32 return from the folded state shown in FIG. 7 to the expanded state shown in FIG. 6, the first sliding member 50 will be blocked by the two protruding portions 304, so as to prevent the first bracket 30 from nipping a finger while the first bracket 30 returns to the state shown in FIG. 6 immediately.

It should be noted that the second sliding groove 320 of the second bracket 32 may also be designed as the first sliding groove 300 shown in FIG. 9 or 10 and it will not be depicted herein again.

As mentioned in the above, when the first bracket and the second bracket are folded with respect to each other, the first linking bar and the second linking bar drive the first linking member and the second linking member to move through the first sliding member and the second sliding member, respectively, so as to compress the first resilient member and the second resilient member. When the external force is released from the hinge structure, the compressed first resilient member and the compressed second resilient member generate elastic forces to push back the first linking member and the second linking member, so as to drive the first linking bar and the second linking bar to rotate through the first sliding member and the second sliding member. Consequently, the first bracket and the second bracket return to an expanded state automatically.

Furthermore, the invention may dispose the hinge structure on the device body of the electronic device. When the first bracket and the second bracket are folded with respect to each other, the device body of the electronic device can be supported on a plane by the hinge structure. At this time, the elastic forces generated by the compressed first resilient member and the compressed second resilient member are balanced off by a support force provided by the plane, such that the first bracket and the second bracket can be kept at the folded state. After removing the electronic device from the plane, the first bracket and the second bracket can return to the expanded state automatically. Moreover, since the invention uses the first resilient member and the second resilient member to provide the elastic forces, the invention can improve the decay rate of the hinge structure effectively during life-cycle test, so as to enhance the life of the hinge structure. Still further, the invention may change the width of the first sliding groove and/or the second sliding groove or add the protruding portion in the first sliding groove and/or the second sliding groove, so as to prevent a finger from being nipped.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A hinge structure comprising:
   a first bracket having a first sliding groove;
   a second bracket having a second sliding groove;
   a first fixing member connected to the first bracket;
   a second fixing member connected to the second bracket;
   a first linking member movably disposed on the first fixing member;
   a second linking member movably disposed on the second fixing member;

a first resilient member disposed on the first fixing member, opposite ends of the first resilient member abutting against the first fixing member and the first linking member;

a second resilient member disposed on the second fixing member, opposite ends of the second resilient member abutting against the second fixing member and the second linking member;

a first linking bar pivotally connected to the second bracket;

a second linking bar pivotally connected to the first bracket, the first linking bar and the second linking bar being pivotally connected to each other;

a first sliding member disposed in the first sliding groove and pivotally connecting the first linking member to the first linking bar; and a second sliding member disposed in the second sliding groove and pivotally connecting the second linking member to the second linking bar.

2. The hinge structure of claim 1, wherein the first sliding member is located at a first end of the first sliding groove when the first bracket is expanded with respect to the second bracket, the first sliding member is located at a second end of the first sliding groove when the first bracket is folded with respect to the second bracket, and a width of the first sliding groove increases gradually from the first end to the second end.

3. The hinge structure of claim 1, wherein the first sliding member is located at a first end of the first sliding groove when the first bracket is expanded with respect to the second bracket, the first sliding member is located at a second end of the first sliding groove when the first bracket is folded with respect to the second bracket, and the first sliding groove has two protruding portions opposite to each other and adjacent to the first end.

4. The hinge structure of claim 1, further comprising a flexible sleeve disposed on the first sliding member.

5. An electronic device comprising:
a device body; and
a hinge structure disposed on the device body, the hinge structure comprising:
   a first bracket having a first sliding groove;
   a second bracket having a second sliding groove;
   a first fixing member connected to the first bracket;
   a second fixing member connected to the second bracket;
   a first linking member movably disposed on the first fixing member;
   a second linking member movably disposed on the second fixing member;
   a first resilient member disposed on the first fixing member, opposite ends of the first resilient member abutting against the first fixing member and the first linking member;
   a second resilient member disposed on the second fixing member, opposite ends of the second resilient member abutting against the second fixing member and the second linking member;
   a first linking bar pivotally connected to the second bracket;
   a second linking bar pivotally connected to the first bracket, the first linking bar and the second linking bar being pivotally connected to each other;
   a first sliding member disposed in the first sliding groove and pivotally connecting the first linking member to the first linking bar; and
   a second sliding member disposed in the second sliding groove and pivotally connecting the second linking member to the second linking bar.

6. The electronic device of claim 5, wherein the first sliding member is located at a first end of the first sliding groove when the first bracket is expanded with respect to the second bracket, the first sliding member is located at a second end of the first sliding groove when the first bracket is folded with respect to the second bracket, and a width of the first sliding groove increases gradually from the first end to the second end.

7. The electronic device of claim 5, wherein the first sliding member is located at a first end of the first sliding groove when the first bracket is expanded with respect to the second bracket, the first sliding member is located at a second end of the first sliding groove when the first bracket is folded with respect to the second bracket, and the first sliding groove has two protruding portions opposite to each other and adjacent to the first end.

8. The electronic device of claim 5, wherein the hinge structure further comprises a flexible sleeve disposed on the first sliding member.

* * * * *